United States Patent
Wei et al.

(10) Patent No.: US 11,485,861 B2
(45) Date of Patent: Nov. 1, 2022

(54) METHOD FOR APPLYING THERMALLY CONDUCTIVE COMPOSITION ON ELECTRONIC COMPONENTS

(71) Applicant: Dow Silicones Corporation, Midland, MI (US)

(72) Inventors: Peng Wei, Shanghai (CN); Fengyi Su, Shanghai (CN); Yan Zheng, Shanghai (CN); Dorab Bhagwagar, Saginaw, MI (US); Debo Hong, Shanghai (CN); Danhuan Ma, Shanghai (CN); Junmin Zhu, Shanghai (CN)

(73) Assignee: Dow Silicones Corporation, Midland, MI (US)

( * ) Notice: Subject to any disclaimer, the term of this patent is extended or adjusted under 35 U.S.C. 154(b) by 288 days.

(21) Appl. No.: 16/758,662

(22) PCT Filed: Jan. 11, 2018

(86) PCT No.: PCT/CN2018/072210
§ 371 (c)(1),
(2) Date: Apr. 23, 2020

(87) PCT Pub. No.: WO2019/136654
PCT Pub. Date: Jul. 18, 2019

(65) Prior Publication Data
US 2020/0354574 A1    Nov. 12, 2020

(51) Int. Cl.
| | | |
|---|---|---|
| C08L 83/06 | (2006.01) | |
| C08K 3/22 | (2006.01) | |
| H05K 7/20 | (2006.01) | |
| C08L 83/04 | (2006.01) | |
| C08K 5/56 | (2006.01) | |

(52) U.S. Cl.
CPC ............ C08L 83/06 (2013.01); C08K 3/22 (2013.01); C08L 83/04 (2013.01); H05K 7/20481 (2013.01); C08K 5/56 (2013.01)

(58) Field of Classification Search
CPC .......... C08L 83/04; C08L 83/06; C08K 3/22; C08K 5/56; H05K 7/20481
See application file for complete search history.

(56) References Cited

U.S. PATENT DOCUMENTS

| | | | |
|---|---|---|---|
| 6,025,435 A | 2/2000 | Yamakawa et al. | |
| 6,169,142 B1 | 1/2001 | Nakano et al. | |
| 6,806,339 B2 | 10/2004 | Cray et al. | |
| 7,479,522 B2 | 1/2009 | Zhu | |
| 2002/0006998 A1 | 1/2002 | Furukawa et al. | |
| 2003/0127496 A1* | 7/2003 | Tetsuka | C08L 83/04 228/180.22 |
| 2007/0219312 A1 | 9/2007 | David | |
| 2010/0006798 A1 | 1/2010 | Endo | |
| 2010/0137529 A1* | 6/2010 | Williams | C09D 183/12 525/474 |

FOREIGN PATENT DOCUMENTS

| | | | |
|---|---|---|---|
| CN | 101962528 | | 2/2011 |
| CN | 102516926 | | 6/2012 |
| JP | 2000232190 | | 8/2000 |
| JP | 2000232190 A | * | 8/2000 |
| JP | 2010013521 | | 1/2010 |
| JP | 2014037460 | | 2/2014 |
| JP | 2014037460 A | * | 2/2014 |
| WO | 2014098204 | | 6/2014 |
| WO | 2019061288 | | 1/2019 |

OTHER PUBLICATIONS

Search report from corresponding China 201880012846.3 application, dated Nov. 5, 2020.
Search report from corresponding Japan 2020-535217 application, dated Oct. 25, 2021.

* cited by examiner

*Primary Examiner* — James C Goloboy

(57) ABSTRACT

A method for forming thermally conductive composition on electronic components comprises three steps, (I) preparing a silicone composition comprising (A) a polyorganosiloxane, (B) a thermally conductive filler and (C) a catalyst, (II) applying the silicone composition on an electronic component of electronic devices, the electronic component generates heat when the electronic devices are working and (III) curing the silicone composition by heat generated by the electronic component.

7 Claims, No Drawings

METHOD FOR APPLYING THERMALLY CONDUCTIVE COMPOSITION ON ELECTRONIC COMPONENTS

FIELD OF THE INVENTION

The present invention relates to a method for forming thermally conductive material on electronic components with an easy and cost-effective manner.

BACKGROUND OF THE INVENTION

Electronic components such as central processing units (CPU), memory chips, semiconductors, transistors, integrated circuits (ICs), light emitting diodes (LEDs), and others known in the art are designed to operate at a normal operating temperature (ex. room temperature) or within a normal operating temperature range. However, the operation of electronic components generate heat. If sufficient heat is not removed, the electronic components will operate at a temperature significantly above its normal operating temperature. Excessive temperature can adversely affect performance of electronic components and operation of the devices associated therewith and negatively impact mean time between failures.

To avoid these problems, heat generated by electronic components is removed and dissipated using thermally conductive materials. Thermally conductive silicone materials have been developed as a high-efficiency thermal transfer material between two surfaces. Many thermally conductive silicone materials are proposed and used in the form of rubbers, elastomers, adhesives, greases and gels.

Thermally conductive gels typically include a crosslinkable silicone polymer such as vinyl-terminated silicone polymer, a crosslinker such as organohydrogenpolysiloxane and a thermally conductive filler. Before thermally conductive gels are cured, they have properties similar to greases and can fully contact with the surface of electronic components. After thermally conductive gels are cured, the crosslinkable groups in the gels are reacted and the crosslinking reactions provide cohesive strength to prevent the migration out.

Although thermally conductive gels have many advantages over other thermally conductive materials, curing step at a manufacture plant of the electronic devices is required. In addition, reworkability (property of a silicone material which can be peeled off from electronic components without remaining on the surface of the components, and re-adhere to electronic components) is also desired for repairing or recycling of electronic components.

SUMMARY OF THE INVENTION

Inventors of this invention have developed a thermally conductive silicone composition which can be cured at a temperature lower than previously known in the art and provides reworkable thermally conductive gel, see PCT/CN17/104360 (application number).

The inventors of this invention also found that the thermally conductive silicone composition can be cured by heat generated by an electronic component of electronic devices when the electronic devices are operated, and developed an easy and cost-effective process for forming a thermally conductive material on an electronic component.

One embodiment of the invention is a method for forming a thermally conductive silicone material on an electronic component, comprising the steps of: (I) preparing a curable silicone composition comprising: (A) a polyorganosiloxane, (B) a thermally conductive filler and (C) a catalyst, where the silicone composition is curable by heat, (II) applying the silicone composition on an electronic component for an electronic device, such electronic component generating heat when the electronic device is in operation, and (III) curing the silicone composition by the heat generated by the electronic component.

Another embodiment of the invention is a method for building a thermally conductive connection between two electronic components for an electronic device, where at least one of the electronic components generates heat when the electronic device containing such electronic components is in operation, and the thermal conductive connection can be separated and re-connected; the method comprises the steps of: (I) preparing a heat-curable silicone composition comprising: (A) a polyorganosiloxane, (B) a thermally conductive filler, (C) a catalyst and (D) a silicone fluid, where the silicone composition is curable by heat; (II) applying the silicone composition on one of the electronic components; (III) placing the other electronic component in contact with the silicone composition and (IV) curing the silicone composition to form a thermal conductive connection between the two electronic components, by heat generated by at least one of the electronic components.

DETAILED DESCRIPTION OF THE INVENTION

Method A

One embodiment of the present invention is a method for forming a thermally conductive silicone material on an electronic component. It comprises the following three steps; (I) preparing a heat-curable silicone composition, (II) applying the silicone composition on an electronic component of electronic devices and (III) curing the silicone composition by heat generated by an electronic component.

Step (I)

In step (I), a silicone composition comprising ingredients (A), (B) and (C) is prepared. The silicone composition is curable by heat.

Ingredient (A)

Ingredient (A) is a polyorganosiloxane. It is also called as "base polymer" or "binder polymer" of the composition. The polyorganosiloxane may have a linear, branched, cyclic, or resinous structure. The polyorganosiloxane may be a homopolymer or a copolymer. The amount of ingredient (A) is, from 2 to 12 weight %, from 2 to 10 weight %, from 2 to 8 weight %, from 2 to 6 weight %, or from 4 to 6 weight %, based on the total weight of the composition. Since the silicone composition is curable by heat, the polyorganosiloxane preferably comprises (A-1) a polyorganosiloxane which has at least two unsaturated organic groups per an average molecule and (A-2) an organohydrogenpolysiloxane which has at least two silicon-bonded hydrogen atoms per an average molecule.

(A-1)

The unsaturated organic groups of the polyorganosiloxane may be alkenyl exemplified by, but not limited to, vinyl, allyl, butenyl and hexenyl. The unsaturated organic groups may be alkynyl groups exemplified by, but not limited to, ethynyl, propynyl and butynyl. The unsaturated organic groups of the polyorganosiloxane may be located at terminal, pendant, or both terminal and pendant positions of the polyorganosiloxane.

The remaining silicon-bonded organic groups of the polyorganosiloxane may be monovalent organic groups free of unsaturation. These monovalent organic groups may have 1 to 20 carbon atoms, alternatively 1 to 12 carbon atoms, and are exemplified by, but not limited to; alkyl groups such as methyl, ethyl, propyl, pentyl, octyl, decyl, undecyl, dodecyl and octadecyl; cycloalkyl groups such as cyclopentyl and cyclohexyl; and aromatic groups such as phenyl, tolyl, xylyl, benzyl and 2-phenylethyl.

Ingredient (A-1) may be a polyorganosiloxane having the general formulae

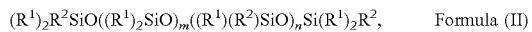

Formula (II)

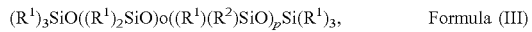

Formula (III)

or a combination thereof.

In Formulae (II) and (III), each $R^1$ is independently a monovalent saturated organic group and each $R^2$ is independently an unsaturated organic group. Subscript m has an average value of at least 2, alternatively subscript m may have a value ranging from 2 to 2000. Subscript n may be 0 or a positive number. Alternatively, subscript n may have an average value ranging from 0 to 2000. Subscript o may be 0 or a positive number. Alternatively, subscript o may have an average value ranging from 0 to 2000. Subscript p has an average value of at least 2. Alternatively subscript p may have an average value ranging from 2 to 2000. Suitable monovalent saturated organic groups for $R^1$ include, but are not limited to; alkyl groups such as methyl group, ethyl group, propyl group, pentyl group, octyl group, decyl group, undecyl group, dodecyl group and octadecyl group; cycloalkyl groups such as cyclopentyl group and cyclohexyl group and aryl groups such as phenyl group, tolyl group, xylyl group, benzyl group, and 2-phenylethyl group. Each $R^2$ is independently an unsaturated monovalent organic group. $R^2$ is exemplified by alkenyl groups such as vinyl group, allyl group and butenyl group and alkynyl groups such as ethynyl group and propynyl group.

Examples of ingredient (A-1) include, but are not limited to, polydiorganosiloxanes such as dimethylvinylsiloxy-terminated polydimethylsiloxane, dimethylvinylsiloxy-terminated poly(dimethylsiloxane/methylvinylsiloxane), dimethylvinylsiloxy-terminated polymethylvinylsiloxane, trimethylsiloxy-terminated poly(dimethylsiloxane/methylvinylsiloxane), trimethylsiloxy-terminated polymethylvinylsiloxane, dimethylvinylsiloxy-terminated poly(dimethylsiloxane/methylphenylsiloxane), dimethylvinylsiloxy-terminated poly(dimethylsiloxane/diphenylsiloxane), phenyl,methyl,vinyl-siloxy-terminated polydimethylsiloxane, dimethylhexenylsiloxy-terminated polydimethylsiloxane, dimethylhexenylsiloxy-terminated poly(dimethylsiloxane/methylhexenylsiloxane), dimethylhexenylsiloxy-terminated polymethylhexenylsiloxane and trimethylsiloxy-terminated poly(dimethylsiloxane/methylhexenylsiloxane) and a combination thereof.

Ingredient (A-1) can be one organopolysiloxane or a mixture of two or more organopolysiloxane that differ in at least one of the following properties: structure, viscosity, average molecular weight, siloxane units and sequence.

(A-2)

The silicon-bonded hydrogen atoms in the organohydrogenpolysiloxane can be located at terminal, pendant, or at both terminal and pendant positions.

The organohydrogenpolysiloxane may comprise siloxane units including, but not limited to, $H(R^3)_2SiO_{1/2}$, $(R^3)_3SiO_{1/2}$, $HR^3SiO_{2/2}$, $(R^3)_2SiO_{2/2}$, $R^3SiO_{3/2}$, and $SiO_{4/2}$ units. In the preceding formulae, each $R^3$ is independently selected from monovalent saturated organic groups.

Ingredient (A-2) may comprise a compound of the formula

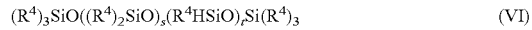

(VI)

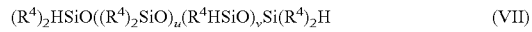

(VII)

or a combination thereof.

In formulae (VI) and (VII) above, subscript s has an average value ranging from 1 to 2,000, subscript t has an average value ranging from 2 to 2,000, subscript u has an average value ranging from 1 to 2,000, and subscript v has an average value ranging from 0 to 2,000. Each $R^4$ is independently a monovalent organic group. Suitable monovalent organic groups include alkyl such as methyl, ethyl, propyl, pentyl, octyl, undecyl and octadecyl; cycloalkyl such as cyclopentyl and cyclohexyl; alkenyl such as vinyl, allyl, butenyl and hexenyl; alkynyl such as ethynyl, propynyl and butynyl; and aryl such as phenyl, tolyl, xylyl, benzyl and 2-phenylethyl.

Examples of ingredient (A-2) include, but are not limited to, dimethylhydrogensiloxy-terminated polydimethylsiloxane, dimethylhydrogensiloxy-terminated poly(dimethylsiloxane/methylhydrogensiloxane), dimethylhydrogensiloxy-terminated polymethylhydrogensiloxane, trimethylsiloxy-terminated poly(dimethylsiloxane/methylhydrogensiloxane), trimethylsiloxy-terminated polymethylhydrogensiloxane, a resin consisting essentially of $H(CH_3)_2SiO_{1/2}$ units and $SiO_{4/2}$ units, and a combination thereof.

The organohydrogenpolysiloxane of ingredient (A-2) may be a combination of two or more organohydrogenpolysiloxanes that differ in at least one of the following properties: structure, average molecular weight, viscosity, siloxane units, and sequence. Dimethylhydrogensiloxy-terminated polydimethylsiloxanes having relatively low degrees of polymerization (e.g., degree of polymerization (DP) ranging from 3 to 50) are commonly referred to as chain extenders, and a portion of the organohydrogenpolysiloxane may be a chain extender.

The amount of ingredient (A-2) in the composition depends on various factors including the SiH content of the organohydrogenpolysiloxane of ingredient (A-2), the unsaturated group content of the polyorganosiloxane of ingredient (A-1), and the properties of the cured product of the composition desired. However, the amount of ingredient (A-2) should be sufficient to provide a molar ratio of SiH groups in the organohydrogenpolysiloxane of ingredient (A-2) to unsaturated organic groups in the polyorganosiloxane of ingredient (A-1) (commonly referred to as the SiH:Vi ratio) ranging from 0.3:1 to 5:1. Alternatively, the amount of ingredient (A-2) may range from 0.1 to 5 weight % based on the composition.

Ingredient (B)

Ingredient (B) is a thermally conductive filler. The thermally conductive filler includes both an electrically conductive filler and an electrically insulating filler. Ingredient (B) comprise a metallic filler, an inorganic filler, a meltable filler, or a combination thereof. Metallic fillers include particles of metals exemplified by aluminum, copper, gold, nickel, silver, and combinations thereof. Inorganic fillers are exemplified by onyx; aluminum trihydrate, metal oxides such as aluminum oxide, beryllium oxide, magnesium oxide, and zinc oxide; nitrides such as aluminum nitride and boron nitride; carbides such as silicon carbide and tungsten carbide; and combinations thereof. Meltable fillers may comprise Bi, Ga, In, Sn, and an alloy thereof, and may optionally further comprise Ag, Au, Cd, Cu, Pb, Sb, Zn, and a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof.

The shape of the thermally conductive filler particles is not specifically restricted, however, rounded or spherical particles may prevent viscosity increase to an undesirable level upon high loading of the thermally conductive filler in the composition.

Ingredient (B) may be a single thermally conductive filler or a combination of two or more thermally conductive fillers that differ in at least one property such as particle shape, average particle size, particle size distribution, and type of filler.

The average particle size of the thermally conductive filler will depend on various factors including the type of thermally conductive filler selected for ingredient (B) and the exact amount added to the curable composition, as well as the bondline thickness of the device in which the cured product of the composition will be used (i.e. the largest particle size should be smaller than the bondline thickness). However, the thermally conductive filler may have an average particle size ranging from 0.1 micrometer to 80 micrometers, alternatively 0.1 micrometer to 50 micrometers, and alternatively 0.1 micrometer to 10 micrometers.

The amount of ingredient (B) in the composition depends on various factors including the thermal conductivity of the filler selected for ingredient (B). However, the amount of ingredient (B) may range from 1% to 85%, alternatively from 30% to 80%, alternatively 50% to 75% by volume of the composition.

Ingredient (C)

Ingredient (C) of the composition is a catalyst of crosslink for polyorganosiloxane. When polyorganosiloxane is formed from (A-1) and (A-2) mentioned above, a catalyst for hydrosilylation reaction is used. Ingredient (C) may comprise a platinum group metal selected from platinum, rhodium, ruthenium, palladium, osmium or iridium metal or organometallic compound thereof, or a combination thereof. Examples of ingredient (C) include, but are not limited to, chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix. Alternatively, the catalyst may comprise 1,3-diethenyl-1,1,3,3-tetramethyldisiloxane complex with platinum. When the catalyst is a platinum complex with a low molecular weight organopolysiloxane, the amount of catalyst may range from 0.04 to 0.4% based on the weight of the curable silicone composition.

Ingredient (C) is added to the composition in an amount that may range from 0.1 ppm to 1,000 ppm, alternatively 1 to 500 ppm, alternatively 2 to 200, alternatively 5 to 150 ppm, by weight of platinum group metal based on the weight of the curable composition.

Ingredient (D)

Ingredient (D) is silicone fluid and an optional ingredient of the silicone composition. It is an organopolysiloxane with 20 to 500 cP of viscosity, and can serve to modify the rheology of the composition. It is considered that the organopolysiloxane works as a release agent for a cured polymer material, formed from the composition. Alternatively, it is considered that the organopolysiloxane works as a surface treating agent of a filler when it has at least one reactive group. The silicone fluid may have a linear or branched structure, and may be a homopolymer or a copolymer.

Silicone fluid may be an organopolysiloxane of

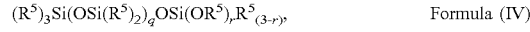

$(R^5)_3Si(OSi(R^5)_2)_qOSi(OR^5)_rR^5_{(3-r)}$,  Formula (IV)

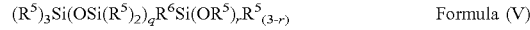

$(R^5)_3Si(OSi(R^5)_2)_qR^6Si(OR^5)_rR^5_{(3-r)}$  Formula (V)

or a combination thereof.

In Formulas (IV) and (V), each $R^5$ is independently a monovalent saturated organic group. $R^6$ is a divalent saturated organic group. Subscript q has an average value of at least 2, alternatively subscript q may have a value ranging from 2 to 2000. Subscript q is preferably from 10 to 230, more preferably from 20 to 185. Subscript r may be an integer from 0 to 3. Suitable monovalent saturated organic groups for $R^5$ include, but are not limited to, alkyl groups such as methyl group, ethyl group, propyl group, pentyl group, octyl group, decyl group, undecyl group, dodecyl group and octadecyl group; cycloalkyl groups such as cyclopentyl group and cyclohexyl group; and aryl groups such as phenyl group, tolyl group, xylyl group, benzyl group and 2-phenylethyl group. $R^6$ include, but are not limited to, alkylene groups such as methylene group, ethylene group, propylene group, pentylene group, octylene group, undecylene group and octadecylene group; cycloalkylene groups such as cyclopentylene group and cyclohexylene group; and arylene groups such as phenylene group.

Examples of silicone fluid include, but are not limited to, $(CH_3)_3Si(OSi(CH_3)_2)nOSi(CH_3)_3$, $C_8H_{17}(CH_3)_2Si(OSi(CH_3)_2)nOSiC_8H_{17}(CH_3)_2$, $C_6H_{13}(CH_3)_2Si(OSi(CH_3)_2)nOSiC_6H_{13}(CH_3)_2$, $C_{10}H_{21}(CH_3)_2Si(OSi(CH_3)_2)nOSiC_{10}H_{21}(CH_3)_2$, $(CH_3)_3SiO(SiO(CH_3)_2)nSi(OCH_3)_3$, $C_8H_{17}(CH_3)_2Si(OSi(CH_3)_2)nOSiC_6H_{12}Si(OCH_3)_3$, $C_6H_{13}(CH_3)_2Si(OSi(CH_3)_2)nOSiC_6H_{12}Si(OCH_3)_3$, $C_{10}H_{21}(CH_3)_2Si(OSi(CH_3)_2)nOSiC_6H_{12}Si(OCH_3)_3$, $C_3H_7(CH_3)_2Si(OSi(CH_3)_2)nOSiC_6H_{12}Si(OCH_3)_3$, $C_6H_{13}(CH_3)_2Si(OSi(CH_3)_2)nOSiC_3H_6Si(OCH_3)_3$, $C_{10}H_{21}(CH_3)_2Si(OSi(CH_3)_2)nOSiC_3H_6Si(OCH_3)_3$, $C_8H_{17}(CH_3)_2Si(OSi(CH_3)_2)nOSiC_3H_6Si(OCH_3)_3$ and $C_3H_7(CH_3)_2Si(OSi(CH_3)_2)nOSiC_3H_6Si(OCH_3)_3$.

Silicone fluid can be one organopolysiloxane, or a mixture of two or more of organopolysiloxane that differ in at least one of the following properties: structure, viscosity, average molecular weight, siloxane units, and sequence.

The viscosity of the silicone fluid is from 20 to 500 cP. Alternatively, the viscosity is from 25 to 500, or from 30 to 350. Lower viscosity organopolysiloxane would more easily migrate out from a final product. Higher viscosity organopolysiloxane gives worse rework performance.

The amount of silicone fluid is, basically from 1 to 10 weight %, preferably from 3 to 8 weight %, more preferably from 3 to 7 weight % based on the total weight of the composition.

Ingredient (E)

Ingredient (E) is a polysiloxane which has Q-branched structure and an optional ingredient for the silicone composition. Ingredient (E) is also helps to increase reworkable property of the cured material. Ingredient (E) is represented by the following Formula (I).

Formula (I)

$$R^aR^b_2Si-O-(R^b_2SiO)_n-Si \begin{array}{c} O-(R^b_2SiO)_n-Si\ R^aR^b_2 \\ | \\ -O-(R^b_2SiO)_n-Si\ R^aR^b_2 \\ | \\ O-(R^b_2SiO)_n-Si\ R^aR^b_2 \end{array}$$

In Formula (I), each $R^a$ is selected from the group consisting of an alkyl group having 1 to 6 carbon atoms, an alkenyl group having 2 to 6 carbon atoms and an alkynyl group having 2 to 6 carbon atoms. At least three of $R^a$ in the compound are alkenyl groups or alkynyl groups. Each $R^b$ is selected from the group consisting of an alkyl group having 1 to 6 carbon atoms, an alkenyl group having 2 to 6 carbon atoms, an alkynyl group having 2 to 6 carbon atoms, an aryl group, an alkoxy group, an acrylate group and a methacrylate group. n is an integer from 1 to 100. The compound is disclosed in U.S. Pat. No. 6,806,339B and the description of the document is incorporated. The amount of Ingredient (E) is, basically from 0.01 to 10 weight %, preferably from 0.5 to 5 weight %, more preferably from 0.5 to 3 weight % based on the total weight of the composition.

Other Ingredients

The silicone composition used for step (I) of Method A may further comprise inorganic filler, filler surface treatment agent or any other ingredients such as inhibitor or pigment, known in the art.

Inorganic Filler (Reinforcing and/or Extending Filler)

Inorganic filler is used to reinforce (and/or extend) the cured polymer material. Examples of the inorganic filler include, but are not limited to, precipitated, fumed or ground silica, precipitated, fumed or ground calcium carbonate, quartz, talc, chopped fiber such as chopped KEVLAR, or a combination thereof. In these filler, fumed silica (in situ-prepared treated silica) is preferable. When fumed silica is used, its preferable surface area is 50 to 600 m²/g, more preferably from 200 to 400 m²/g. Filler can be used as it is, or can be treated by a surface treatment agent such as an alkoxysilane at least partially.

The amount of inorganic filler in the composition may range from 0.1% to 10% by weight based on the weight of the composition.

Filler Surface Treatment Agent

Filler surface treatment agent is used to treat the surface of thermal conductive filler or inorganic filler disclosed above. Treating agents and treating methods are known in the art, see for example, U.S. Pat. No. 6,169,142.

The amount of filler surface treatment agent in the composition may vary depending on various factors including the type and amounts of fillers selected for components (B) and any other inorganic filler, but may comprise an amount ranging from 0.1% to 2% by weight based on the weight of the composition.

Step (II)

In step (II), the heat-curable silicone composition disclosed above is applied on an electronic component of electronic devices before heating. Any known method can be used when applying the silicone composition, such as spin coating, blade coating, dispensing, stencil printing and screen printing, and patterning. The amount of the silicone composition applied may be any amount as needed, but typically about at a thickness of 100 micrometers to 1 millimeter. The silicone composition is applied preferably without airspace or bubbles between the silicone composition and the electronic component, for an effective thermal transfer. To avoid air bubbles from forming after heating, the silicone composition may be degassed prior to application.

As mentioned above, electronic components such as central processing units (CPUs), memory chips or semiconductors generate heat when the electronic devices that contain them are in operation. For example, the temperature of a smartphone CPU becomes 40 to 80 degrees C. when the smartphone is used for 10 minutes or more. Examples of the electronic component which generates heat during the electronic device is operated comprise central processing units (CPU), graphics processing units (GPU), memory chips, driver chips and optical modules. Examples of the electronic devices include smartphones, digital cameras, computers, pad devices, servers and base stations for communication.

Step (III)

In step (III), the silicone composition is cured by heat generated by the electronic component to which the composition is applied proximally, and becomes a thermal conductive material (cured material). The curing step may be conducted at from 40 to 80 degrees C. for 4 to 20 hours.

The cured polymer material has 0.5 to 8 W/mK of thermal conductivity, and is useful for thermal transfer materials. An exemplary cured material has the following physical and thermal characteristics: Tensile strength from 0.1 Mpa to 10 Mpa, elongation from 20% to 600%, hardness from 10 to 70 in Shore A scale, dielectric strength over 14 KV/mm, Volume Resistivity over 1.0E+14 Ohm*cm.

In addition, when the thermal conductive silicone composition comprises ingredient (D), the cured polymer material can be peeled off from an electronic component and an electronic device. For example, the cured polymer material of the present invention can be peeled off from a heat sink or an IC surface without remaining the surface of the heat sink or the IC surface. In addition, the cured polymer material of the present invention can be peeled off from an electronic component or an electronic device, without breaking into two or more pieces.

Method B

Another embodiment of the present invention is a method for building a thermal conductive connection between two electronic components of an electronic device. It comprises the following four steps: (IV) preparing a heat-curable silicone composition, (V) applying the silicone composition on one of the electronic components, (VI) placing the other electronic component in contact with the silicone composition and (VII) curing the silicone composition to form a thermal conductive connection between the two electronic components, by heat generated by at least one of the electronic components.

Step (IV)

In step (IV), a silicone composition comprising ingredients (A), (B), (C) and (D) is prepared. Each ingredients (A) to (D) and the amount of these ingredients are same as those mentioned in Method A. The silicone composition is curable by heat. Also, the silicone composition may further comprise a silicone fluid, inorganic filler and any other ingredients such as inhibitor or pigment, as mentioned in Method A.

Step (V)

In step (V), the heat-curable silicone composition is applied on one of the electronic components before heating. At least one of the electronic components generates heat when the electronic device that contains them is operating. Examples of the electronic components which generate heat during the electronic device is operated include central processing units (CPU), graphics processing units (GPU), memory chips, driver chips and optical modules. Examples of the electronic components which do not generate heat but are connected to any of the above electronic components through thermally conductive material include heat sinks, cooling plates/pads including liquid cooling plates/pads, and cooling tubes including liquid cooling tubes. In step (V), the silicone composition can be applied on either electronic components which generate heat or those which do not generate heat.

As with Method A, any known method can be used when applying the silicone composition, for example, spin coating, blade coating, dispensing, stencil printing and screen printing, and patterning.

Step (VI)

In step (VI), a second electronic component other than the first electronic component used in step (V) is placed on the silicone composition that has been applied to the first electronic component. As a result, a sandwich structure, where the silicone composition is placed in between two electronic components, is created. The silicone composition may be applied on the surface of either a heat generating electronic component or a heat-dissipating or cooling electronic component. Sufficient pressure is applied on electronic components toward the silicone component layer to obtain the desired bond line thickness while avoiding damages to the electronic components. One or more screws or clamps may then be used to fix the sandwich structure.

Step (VII)

In step (VII), the silicone composition mentioned above is cured to form a thermal conductive connection, by heat generated by at least one of the electronic components. The platinum catalyst is released at 60 degree and polyorganosiloxane starts crosslinking under hydrosilylation reaction and finally forms a cured elastic silicone material.

The thermal conductive connection formed by this method can be separated and re-connected, because the thermal conductive material between the two electronic components obtained by this method is reworkable.

EXAMPLES

The raw materials shown in Table were used to prepare a silicone composition in Example.

TABLE 1

| Material Type | Description | Supplier | Amount (unit: weight %) |
|---|---|---|---|
| A-1 | Dimethyl Siloxane, Dimethylvinylsiloxy-terminated, viscosity of 40,000 cP | Dow Corning | 2.58 |
| A-2 | Dimethyl, Methylhydrogen Siloxane, Trimethylsiloxy-terminated, viscosity ~20 cP at 25° C., SiH content ~0.10% | Dow Corning | 0.7 |
| B-1 | Alumina filler, D50 of 20 um | ZRI | 56.5 |
| B-2 | Alumina filler, D50 of 2 um | Sumitomo | 28 |
| C | 1,3-diethenyl-1,1,3,3-tetramethyldisiloxane complex with platinum and a dimethylsiloxane with phenyl silsesquioxane, 0.4 wt % of platinum | Dow Corning | 0.2 |
| D | Dimethyl Siloxane, Mono-trimethoxysiloxy- and Trimethylsiloxy-terminated, viscosity of 130 cP | Dow Corning | 5.1 |
| E | Q-branched Dimethyl Siloxane, Dimethylvinylsiloxy-terminated, viscosity of 250 cP | Dow Corning | 1.4 |
| Others | Mixture of a dimethyl Siloxane, Dimethylvinylsiloxy-terminated (viscosity of 64 Pa · s) and a treated fumed silica at weight ratio of 74:26 | Dow Corning | 5.5 |
| Others | Methyl(tris(1,1-dimethyl-2-propynyloxy))silane | Dow Corning | 0.0003 |
| Others | Iron(III) Oxide | Dow Corning | 0.02 |
| Total | | | 100.0003 |

Example 1

The raw materials listed in Table 1 were added in a reaction vessel with a mixer. These raw materials were mixed at 25° C. for 2 minutes at 1500 rpm. The obtained composition was applied on a surface of a test substrate by using Nordson EFD 300 ml dispensing system. The parameters for dispensing are shown in Table 2.

The dispensed silicone composition was cured at 60 degrees C. for 5 hours, and formed a cured silicone material. The cured polymer material has 0.5 to 8 W/mK of thermal conductivity, tensile strength from 0.1 MPa to 10 MPa, elongation from 20% to 600%, hardness from 10 to 70 in Shore A scale, dielectric strength over 14 KV/mm, and volume resistivity of over 1.0E+14 Ohm*cm.

TABLE 2

| Equipment | Nordson EFD 300 ml dispensing system |
| --- | --- |
| Needle size | 0.6 mm |
| Pressure | 0.35 MPa |
| Speed | 15 mm/s |
| Dispensing path | Program |
| Needle height | Contact |
| Dispensing Area | 15 mm × 15 mm (15 mm square) |

The silicone composition was applied on the heat generator surface and attached to the heat sink surface. After fully cured, when the heat generator and the heat sink were separated, the silicone composition remained on either the heat generator surface or the heat sink surface and did not rip. When the cured silicone composition was peeled off manually from the surface in a manner simulating the operation of repairing, no residues remained on the surface by visual observation, indicating that the cured silicone composition can be peeled off completely.

What is claimed is:

1. A method for forming a thermally conductive silicone material on an electronic component, comprising the steps of:
   (I) preparing a silicone composition comprising:
      (A) a polyorganosiloxane,
      (B) a thermally conductive,
      (C) a catalyst, and
      (E) a polysiloxane which has O-branched structure represented by the Formula (I):

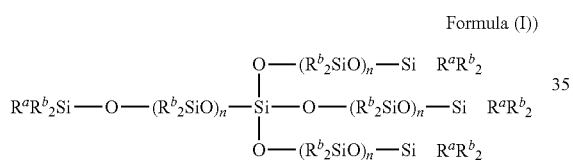

(Formula (I))

wherein each $R^a$ is selected from the group consisting of an alkyl group having 1 to 6 carbon atoms, an alkenyl group having 2 to 6 carbon atoms and an alkynyl group having 2 to 6 carbon atoms, at least three of $R^a$ in the compound are alkenyl groups or alkynyl groups, each $R^b$ is selected from the group consisting of an alkyl group having 1 to 6 carbon atoms, an alkenyl group having 2 to 6 carbon atoms, and alkynyl group having 2 to 6 carbon atoms, an aryl group, an alkoxy group, an acrylate group and a methylacrylate group, and n is an integer from 1 to 100;
   wherein the silicone composition is curable by heat,
   (II) applying the silicone composition on an electronic component for an electronic device, in which the electronic component generates heat when the electronic device which contains the electronic component is in operation, and
   (III) curing the silicone composition by heat generated by the electronic component.

2. The method of claim 1, wherein the temperature of the electronic component is higher than room temperature and lower than 80 degrees C. when the silicone composition is cured at step (III).

3. The method of claim 1, wherein the electronic component is selected from a central processing unit, a graphics processing unit, a memory chip, a driver chip and an optical module.

4. The method of claim 1, wherein the electronic device is selected from a smartphone, a digital camera, a computer, a pad device, a server, and a base station for communication.

5. The method of claim 1, wherein the silicone composition further comprises (D) a silicone fluid.

6. The method of claim 5, wherein the thermally conductive silicone material can be removed from the electronic component in one piece.

7. A method for building a thermal conductive connection between two electronic components of an electronic device, wherein at least one of the electronic components generates heat when the electronic device is in operation, and the thermal conductive connection can be separated and re-connected; the method comprising the steps of:
   (IV) preparing a heat-curable silicone composition comprising:
      (A) a polyorganosiloxane,
      (B) a thermally conductive filler,
      (C) a catalyst,
      (D) a silicone fluid, and
      (E) a polysiloxane which has O-branched structure represented by the Formula (I):

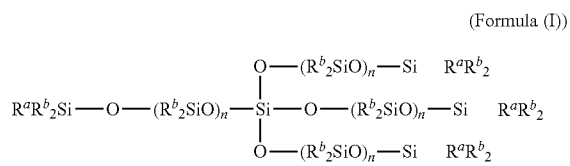

(Formula (I))

wherein each $R^a$ is selected from the group consisting of an alkyl group having 1 to 6 carbon atoms, an alkenyl group having 2 to 6 carbon atoms and an alkynyl group having 2 to 6 carbon atoms, at least three of $R^a$ in the compound are alkenyl groups or alkynyl groups, each $R^b$ is selected from the group consisting of an alkyl group having 1 to 6 carbon atoms, an alkenyl group having 2 to 6 carbon atoms, and alkynyl group having 2 to 6 carbon atoms, an aryl group, an alkoxy group, an acrylate group and a methylacrylate group, and n is an integer from 1 to 100; and
   in which the silicone composition is curable by heat,
   (V) applying the silicone composition on one of the electronic components,
   (VI) putting the other electronic component on the silicone composition and
   (VII) curing the silicone composition to form a thermal conductive connection, by heat generated by at least one of the electronic components.

* * * * *

UNITED STATES PATENT AND TRADEMARK OFFICE
CERTIFICATE OF CORRECTION

| | | |
|---|---|---|
| PATENT NO. | : 11,485,861 B2 | Page 1 of 1 |
| APPLICATION NO. | : 16/758662 | |
| DATED | : November 1, 2022 | |
| INVENTOR(S) | : Wei et al. | |

It is certified that error appears in the above-identified patent and that said Letters Patent is hereby corrected as shown below:

In the Claims

Claim 1, section E, should read "Q-branched" rather than "O-branched"
Claim 7, section E, should read "Q-branched" rather than "O-branched"

Signed and Sealed this
Twenty-eighth Day of February, 2023

*Katherine Kelly Vidal*

Katherine Kelly Vidal
*Director of the United States Patent and Trademark Office*